(12) United States Patent
Hotz et al.

(10) Patent No.: US 8,461,855 B2
(45) Date of Patent: Jun. 11, 2013

(54) DEVICE INTERFACE BOARD WITH CAVITY BACK FOR VERY HIGH FREQUENCY APPLICATIONS

(75) Inventors: Peter Hotz, Markt Schwaben (DE); Wolfgang Steger, Triefing / Scheyern (DE)

(73) Assignee: Teradyne, Inc., North Reading, MA (US)

( * ) Notice: Subject to any disclaimer, the term of this patent is extended or adjusted under 35 U.S.C. 154(b) by 348 days.

(21) Appl. No.: 12/572,955

(22) Filed: Oct. 2, 2009

(65) Prior Publication Data

US 2011/0080187 A1   Apr. 7, 2011

(51) Int. Cl.
*G01R 31/02*   (2006.01)

(52) U.S. Cl.
USPC .............. 324/756.01; 324/756.02; 324/757.02

(58) Field of Classification Search
USPC ......................................................... 324/765
See application file for complete search history.

(56) References Cited

U.S. PATENT DOCUMENTS

| | | | |
|---|---|---|---|
| 4,996,391 A | | 2/1991 | Schmidt |
| 5,210,485 A | * | 5/1993 | Kreiger et al. ............ 324/750.25 |
| 5,491,426 A | * | 2/1996 | Small ...................... 324/754.18 |
| 6,392,160 B1 | | 5/2002 | Andry et al. |
| 6,663,442 B1 | | 12/2003 | Helster et al. |
| 6,791,317 B1 | | 9/2004 | Walsh et al. |
| 6,871,776 B2 | | 3/2005 | Trucco |
| 7,174,490 B2 | * | 2/2007 | Evans .......................... 714/724 |
| 7,246,434 B1 | | 7/2007 | Taylor et al. |
| 7,285,972 B2 | * | 10/2007 | Sommerfeld et al. ... 324/750.26 |
| 7,339,385 B2 | * | 3/2008 | Takasu et al. ............. 324/756.04 |
| 2002/0117330 A1 | * | 8/2002 | Eldridge et al. .............. 174/260 |
| 2004/0174180 A1 | | 9/2004 | Fukushima et al. |
| 2006/0082358 A1 | * | 4/2006 | Conner ..................... 324/158.1 |
| 2006/0125498 A1 | | 6/2006 | Liu et al. |
| 2009/0151993 A1 | | 6/2009 | Yaghmai et al. |

FOREIGN PATENT DOCUMENTS

| | | |
|---|---|---|
| EP | 0961321 A2 | 12/1999 |
| WO | WO 2007/127348 A2 | 11/2007 |

OTHER PUBLICATIONS

International Search Report and Written Opinion for International Application No. PCT/US2010/050861, mailed Jan. 28, 2011.
Cohen et al., "Design Considerations for Gigabit Backplane Systems," DesignCon 2000, 2000 High-Performance System Design Conference.

* cited by examiner

*Primary Examiner* — Thomas Valone
(74) *Attorney, Agent, or Firm* — Wolf, Greenfield & Sacks, P.C.

(57) ABSTRACT

In one embodiment, a device interface board is provided which includes a printed circuit board with a DUT interface structure, such as socket, associated with a DUT side of the printed circuit board. A high frequency connector and electronic component are mounted in a cavity formed in a back side of the printed circuit board. A signal via through the printed circuit board couples the high frequency connector and electronic component with the DUT interface structure. An encapsulating structure may be provided, which covers the cavity while allowing a cable to connect to the high frequency connector.

26 Claims, 6 Drawing Sheets

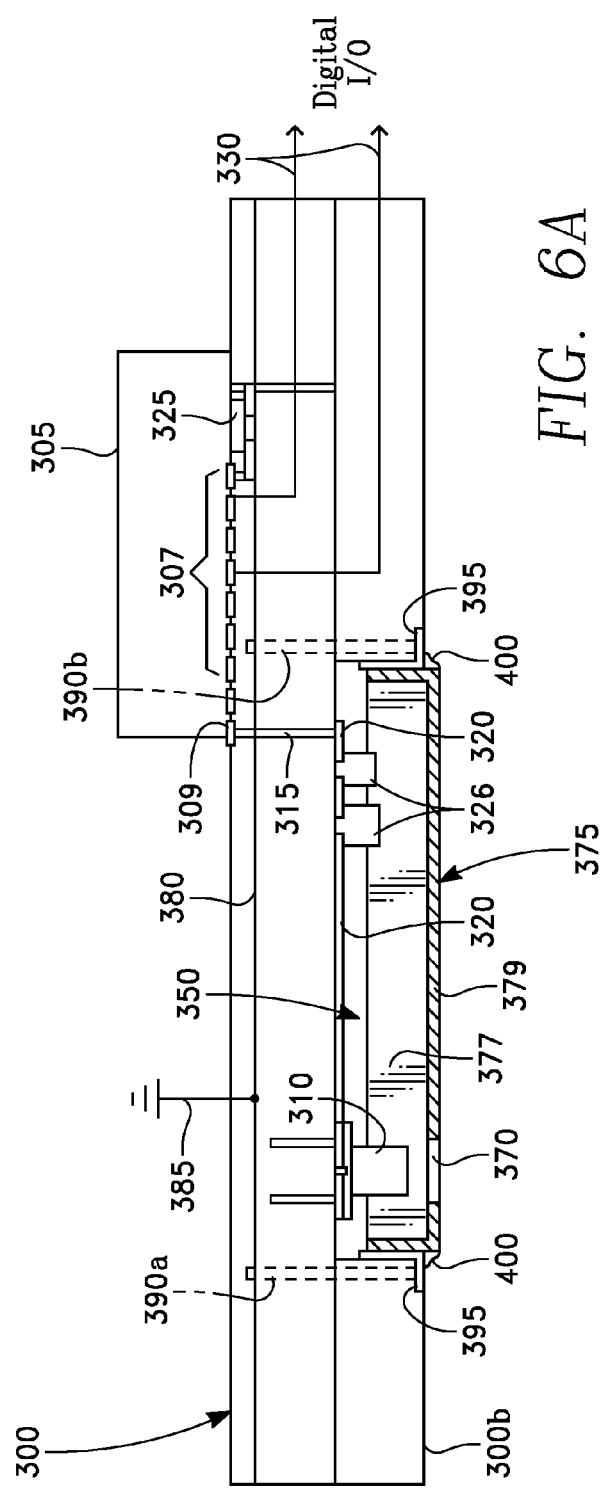
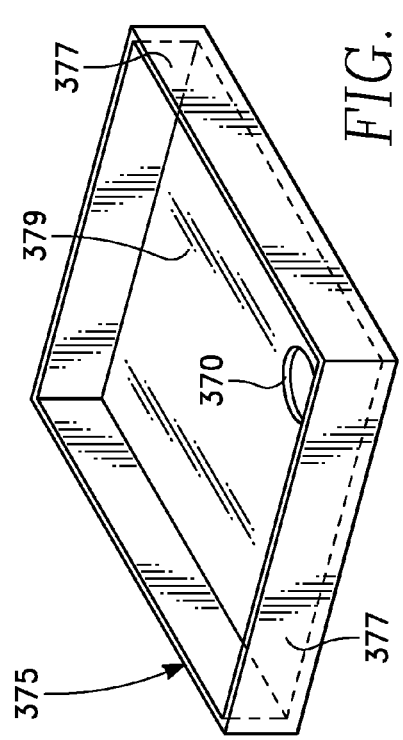
FIG. 6A
FIG. 6B

DEVICE INTERFACE BOARD WITH CAVITY BACK FOR VERY HIGH FREQUENCY APPLICATIONS

BACKGROUND

For high performance semiconductor testers, sometimes referred to as automated test equipment or ATE, tester signals up to several gigahertz are funneled from test electronics through relatively large circuit boards known as device interface boards (DIB's) to the leads of one or more very compact devices-under-test or DUT's. The DUT's often are designed to include very high frequency analog signals to be included with high performance digital signals. These very high frequency analog signals include, for example, cellular telephone radio frequency signals, global positioning radio signals, wireless communication radio signals, etc. In today's high performance systems-on-a-chip (SOC), there are often several hundreds signal paths between the DUT and the tester electronics. In order to preserve fidelity for such high-frequency signals, the signal paths are constructed to provide a closely matched impedance (normally fifty ohms). Providing a closely matched impedance with a large number of signal paths is difficult.

The DIB is mounted on the automatic test equipment such that the electronic signals that are to be exchanged between the test electronics commonly referred to as a test head and the DUT are transferred through cables that connect to the DIB from the bottom side or tester side either directly with pogo pins or with the OSP, SMA, SMP or other high-speed connectors. The DUT is connected with a socket, which is mounted on the top side or DUT side of the DIB. The SMA coaxial connectors (Subminiature A originally designed by Bendix Scintilla Corporation), the OSP coaxial connectors (Omni-Spectra push-on originally designed by M/A Com of Lowell, Mass.), and the SMP coaxial connectors (originally invented by the Gilbert company) are commonly produced by companies such as Tyco Electronics Corporation, Berwyn, Pa.

The cables connected to a bottom side of the DIB and the DUT connected through a socket at the top side of the DIB are connected with conductive traces (strip lines or microstrip lines) and vias to connect traces of different layers. Further, the DIB contains various electronic components like Balanced/Unbalanced Transformers (BalUns), inductors, capacitors, and/or resistors, etc. to condition the test signals to ensure a good match between the tester resources and the DUT requirements. As the complexity of the systems-on-a-chip has increased the number of signals being transferred between the test head and the DUT, the thickness of the DIB has increased due to higher digital pin count.

As DIB's have increased in size, they require more thickness to realize the same stability. Additionally, multisite testing requirements (multiple DUT's are tested simultaneously) to reduce cost of test increase the wiring requirements of the DIB. This forces additional layers to be provided for routing all the wiring traces for all the signal channels. Currently the DIB requires up to twenty signal layers (approximately 5.08 mm) and in the future, at least thirty signal layers will be required, increasing the thickness by a factor of at least 1.5. As more layers are required the thickness of the DIB increases. As the numbers of signals is increasing, more of the connectors such as the pogo pins are needed. This creates more mechanical pressure on DIB, thus requiring a thicker printed circuit board so that the increase pressure can be sustained without damage to the printed circuit board.

FIG. 1 is a simplified block diagram of an automatic test equipment 100. The automatic test equipment 100 includes a tester mainframe 102 that is in communication with a test head 108. The test head 108 is connected to an DIB 106. Signals from the test head 108 may be routed to the DIB 106 through cable assemblies. In operation, the DIB 106 is electrically connected to a device under test (DUT) 104 for testing the DUT 104. For example, the automated test equipment (ATE) system 100 is for testing integrated circuits, and the DUT 104 may be a semiconductor device including integrated circuits that perform digital and analog functions. Examples of high performance analog functions are cellular telephone transmitters and receivers, digital wireless transmitters and receivers, radio frequency identification transmitters and receivers. Thus, signals from the test head 108 are routed through the DIB 106 to the DUT.

The tester mainframe 102 includes circuitry for generating test stimulus signals that are transferred through the test head 108 and the DIB 106 to the DUT 104 and evaluating test response signals received from the DUT 104 through the DIB 106 and the test head 108. The DUT 104 may be a packaged silicon die including an integrated circuit to be tested. The DIB 106 may also be connected to a probe interface card with the DUT 104 being a semiconductor wafer including integrated circuits to be tested that is mounted to the probe interface card.

FIG. 2 is a diagram of a cross-sectional view of a DIB printed circuit board 200. DIB printed circuit board 200 has a DUT socket 205 that is connected by compression connectors such as spring or pogo pin contacts 207 and 209 to metal wiring traces on the surface of the DIB printed circuit board 200. In the case where the DUT is an integrated circuit that performs digital and analog functions, the digital signals 230 are often segregated from the analog signals 235, especially for very high Radio Frequency (RF) signals. The analog signals 235 are transferred from the DUT through the pin 209 of the socket to a via 215. The via 215 is a hole drilled and plated in the DIB printed circuit board 200. The via 215 is connected to a metal wiring trace 220 that is connected to the coaxial connector 210. The coaxial connector 210 may be OSP, SMA, SMP or other high-speed connectors. The analog signals 235 are transferred between the coaxial connector 210 and the test head 108 of FIG. 1. The electronic components 226 are placed in contact with the wiring traces 220 to provide compensation and termination circuitry necessary to insure the signal fidelity of the analog signals 235.

As noted above, the increased circuit complexity and the growth in wiring density has increased the thickness of the DIB printed circuit board. As the DIB printed circuit board has increased in thickness, the performance has typically dropped for high-speed signals. One of the major detriments to the performance is the via 215. It is known in the art that vias have poor high-speed performance, since they represent an impedance discontinuity for GHz frequency analog signals 235. A long via 215 causes a problem for certain matching techniques, since components/circuitry 226 is too far away from DUT socket 205. It is difficult to place matching electronic components 225 in a more desirable location on the top side of the DIB printed circuit board 200, between the DUT socket 205 and the DIB printed circuit board 200, because there is insufficient space under the DUT socket 205 due to the increased RF pin count of the DUT.

Refer now to FIG. 3A for an example of a DIB printed circuit board 201 used for measuring the performance of very high frequency analog signals 235. In this example, the DIB printed circuit board 201 has an SMA coaxial connector 210 connected to the via 245. The via 245 is connected to the metal wiring trace 220 that is connected for this evaluation to a 50 Ω resistor 240 that is connected to a ground reference point 222. The SMA coaxial connector 210 has a shield that is placed in the vias 250. The vias 250 are also connected internally within the DIB printed circuit board 201 to the ground reference point.

In this example, the DIB printed circuit board 201 is constructed to be approximately 5.08 mm thick. This representative of the thickness employed for DIB printed circuit board 201 at the current time. As the complexity of integrated circuits increases, this thickness will be greater. The SMA connector is connected with the 50 Ω terminating resistor 240 after the via 245 that is approximately 5.08 mm (0.2") in length.

FIG. 3B is a plot of the reflection of a signal passed through the SMA coaxial connector 210 through the via 245 to the 50 Ω terminating resistor 240, for the example of FIG. 3A. In the example of FIG. 3A, there is a −10 dB signal reflection 260 at 2 GHz. With the 5.08 mm length via 245, ten percent of the delivered power is reflected 260. The reflection 260 of this magnitude results in a loss of power and causes more difficulty in matching and compensation of the analog signals 235 to maintain signal fidelity.

Therefore, what is needed is a DIB printed circuit board constructed to provide a low loss in the wiring path of very high speed analog signals to maintain high signal quality and fidelity.

SUMMARY

In one embodiment, a device interface board is provided which includes a printed circuit board with a DUT interface structure, such as socket, associated with a DUT side of the printed circuit board. A high frequency connector and electronic component are mounted in a cavity formed in a back side of the printed circuit board. A signal via through the printed circuit board couples the high frequency connector and electronic component with the DUT interface structure. An encapsulating structure may be provided, which covers the cavity while allowing a cable to connect to the high frequency connector.

BRIEF DESCRIPTION OF THE DRAWINGS

FIG. 6A is a diagram of a cross-sectional view of the embodiment of a DIB printed circuit board of FIG. 5 illustrating another implementation of the structure of the encapsulating structure.

FIG. 6B shows a perspective view of a second example of an encapsulating structure.

DESCRIPTION

Figure 1:
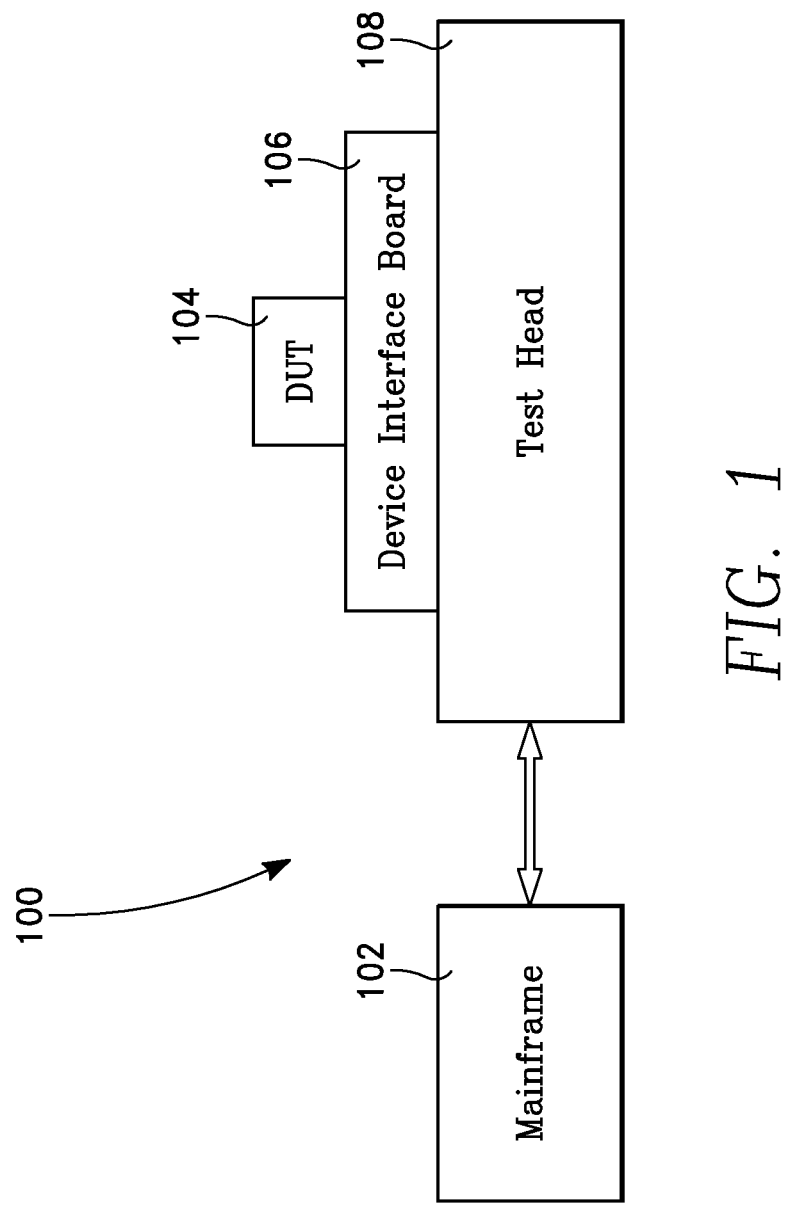
FIG. 1 is a simplified block diagram of an automatic test equipment system.
Figure 2:
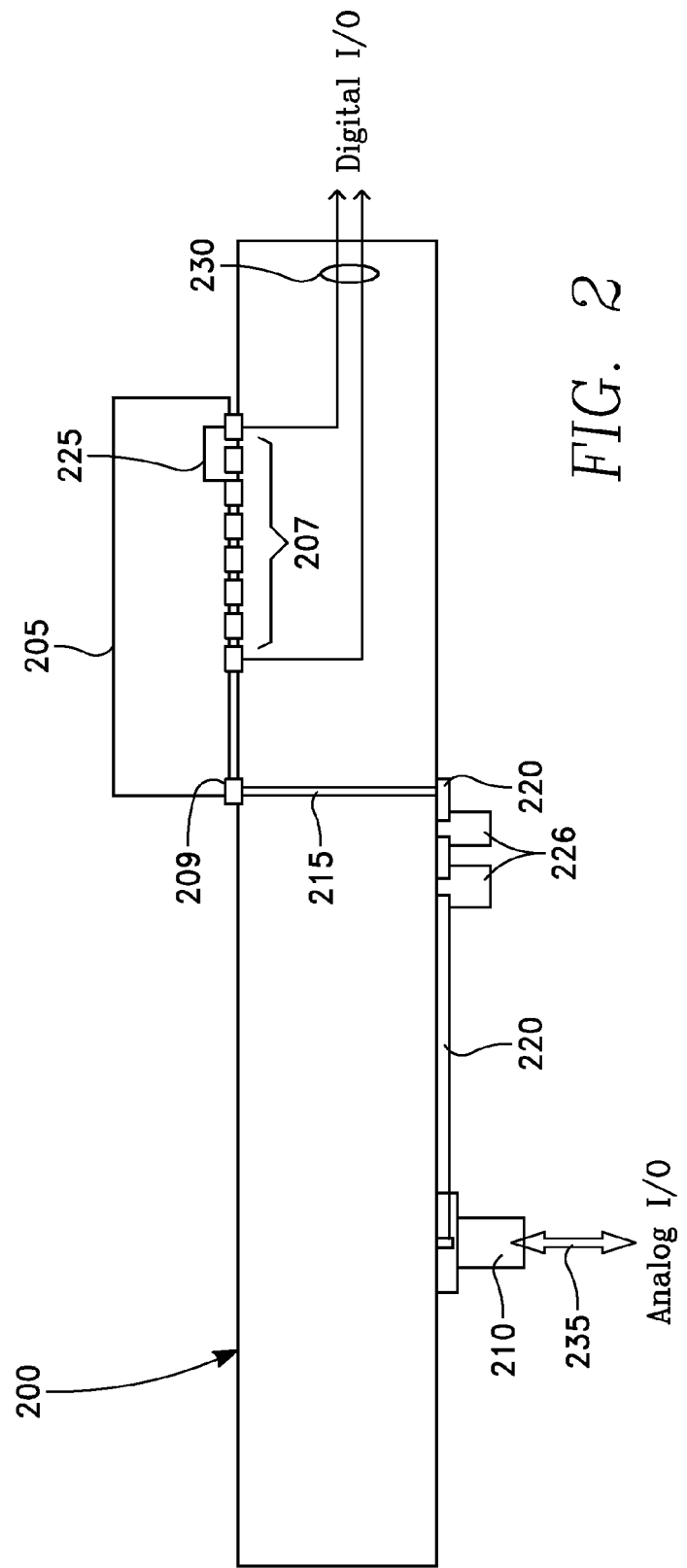
FIG. 2 is a diagram of a cross-sectional view of a DIB printed circuit board.

As described in FIG. 1, the automatic test equipment 100 includes a tester mainframe 102 that is in communication with a test head 108. The test head 108 is connected to a DIB 106. Signals from the test head 108 are routed to the DIB 106 through cable assemblies. In operation, the DIB 106 is electrically connected to a device under test (DUT) 104 for testing the DUT 104. In FIG. 2, the electronic components 226 are placed in contact with the wiring traces 220 to provide impedance matching, compensation, and termination circuitry necessary to insure the signal fidelity of the analog signals 235, however, the long via 215 causes a problem for certain matching techniques, since components/circuitry is too far away from DUT socket 205. Therefore, in one embodiment, an automatic test equipment system includes a test head 108 and DIB 106. The test head 108 incorporates electronic circuitry for generating test stimulus signals for transfer to at least one device-under-test 104 and for receiving and evaluating test response signals from the at least one device-under-test 104. The DIB 106 is placed between the test head 108 and the at least one device-under-test 104 to prevent signal degradation of very high frequency signals.

Figure 4:
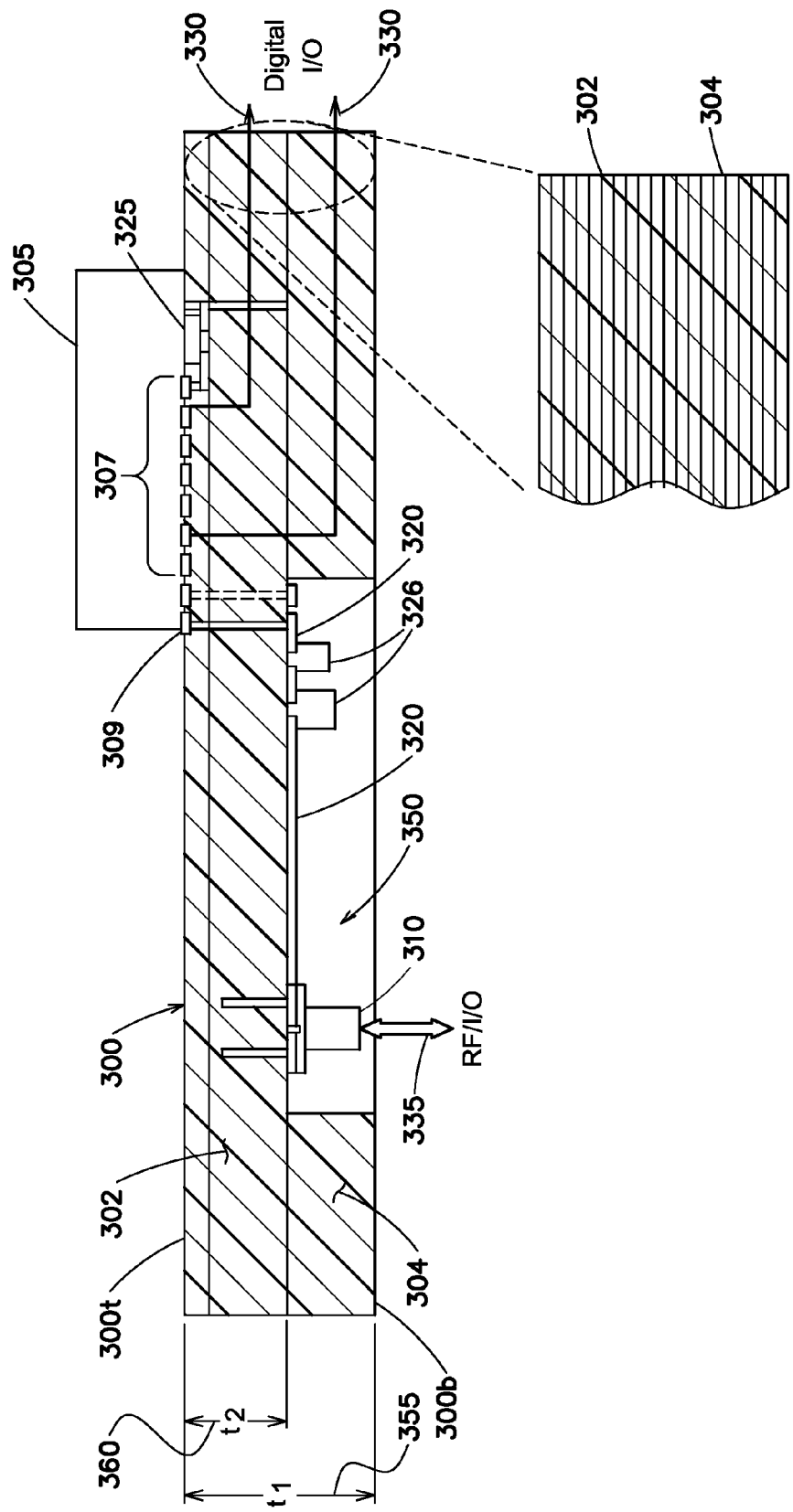
FIG. 4 is a diagram of a cross-sectional view of an embodiment of a DIB printed circuit board.

FIG. 4 is a diagram of one embodiment of a cross-sectional view of a device interface (DIB) printed circuit board 300. The device interface board includes a printed circuit board 300 having a first thickness 355. The DIB printed circuit board 300 has a DUT socket 305 in contact with to metal wiring traces on the top surface 300t of the DIB printed circuit board 300 through spring or pogo pin contacts 307 and 309. As described above, where the DUT is an integrated circuit that performs digital and analog functions, the digital signals 330 are often segregated from the analog signals 335, especially for very high RF frequencies. The analog signals 335 are transferred from the DUT through the pins 309 of the DUT socket 305 to a via 315.

A cavity 350 that is formed in a back side or tester side 300b (tester side), of the DIB printed circuit board 300 decreases the thickness of the printed circuit board 300 under the cavity to a second thickness 360, which may be for example, one half of the thickness 355 of the DIB printed circuit board 300. In one example embodiment, a 20 layer DIB printed circuit board 300 is 5.08 mm and the cavity is 2.54 mm.

The cavity 350 is located in close proximity to the DUT socket 305. A connector 310 and electronics components 320 are mounted within the cavity 350 for transferring the very high frequency signals 335 between the test head 108 and the DUT 104 of FIG. 1. A via 315 is drilled and plated in the printed circuit board 300 within the cavity 350 to connect the connector 310 and electronic components 325 to the DUT socket 305 and thus to the device-under-test. The via 315 may be formed prior to or after formation of the cavity 350. The electronic components 325 are placed in contact with the wiring traces 320 to provide impedance matching, compensation, and termination circuitry necessary to insure the signal fidelity of the analog signals 335. The electronic components 325 are Balanced/Unbalanced Transformers (BalUns), inductors, capacitors, and/or resistors, etc. that condition the test signals to insure the signal fidelity.

One advantage of locating the electronic components 326 in the cavity 350 along with the connector in some embodiments is that the electronic components may be more easily accessed during DIB fabrication, test, and rework. The electronic components 226 of FIG. 2 are placed beneath the DUT socket 205 between the DUT socket 205 and the board 200. As such, the electronic components 226 are not easily accessed for adjustment, change, or replacement. The electronic components 326 in the embodiment of FIG. 4, however, are easily accessed during fabrication, or maintenance, to allow proper impedance matching, compensation, and termination circuitry to ensure the fidelity of the test signals.

The cavity 350 may be formed in the back side 300b of the printed circuit board 300 by a machining process to remove material from the printed circuit board 300. The machining process may be milling, planing, routing, or shaping a surface of the back side 300b to reduce thickness of the printed circuit board to the second thickness 360 that is a fractional part such as approximately one half the original thickness of the printed circuit board 300.

In other embodiments, the cavity 350 is formed in the back side 300b of the printed circuit board 300 by laying up multiple layer preimpregnated laminate stacks 302 until the printed circuit board 300 has achieved the second thickness 360 that is a fractional part the first thickness 355 or the final thickness of the printed circuit board 300. Multiple laminate layers 304 are formed to have openings in the cavity region 350. The laminate layers with the cavity 350 are added until sufficient laminate layers 304 are accumulated that the printed circuit board achieves the first thickness 355. Generally the laminate layers 302 have a material that has a stable, suitable dielectric constant for extremely high RF applications. The laminate layers 304 may have the dielectric constant similar to that of the laminate layer 302 or a material that is a standard combination of thermoplastic or thermosetting polymers reinforced with nonconductive fibers such as fiber glass reinforced epoxy.

Figure 5A:
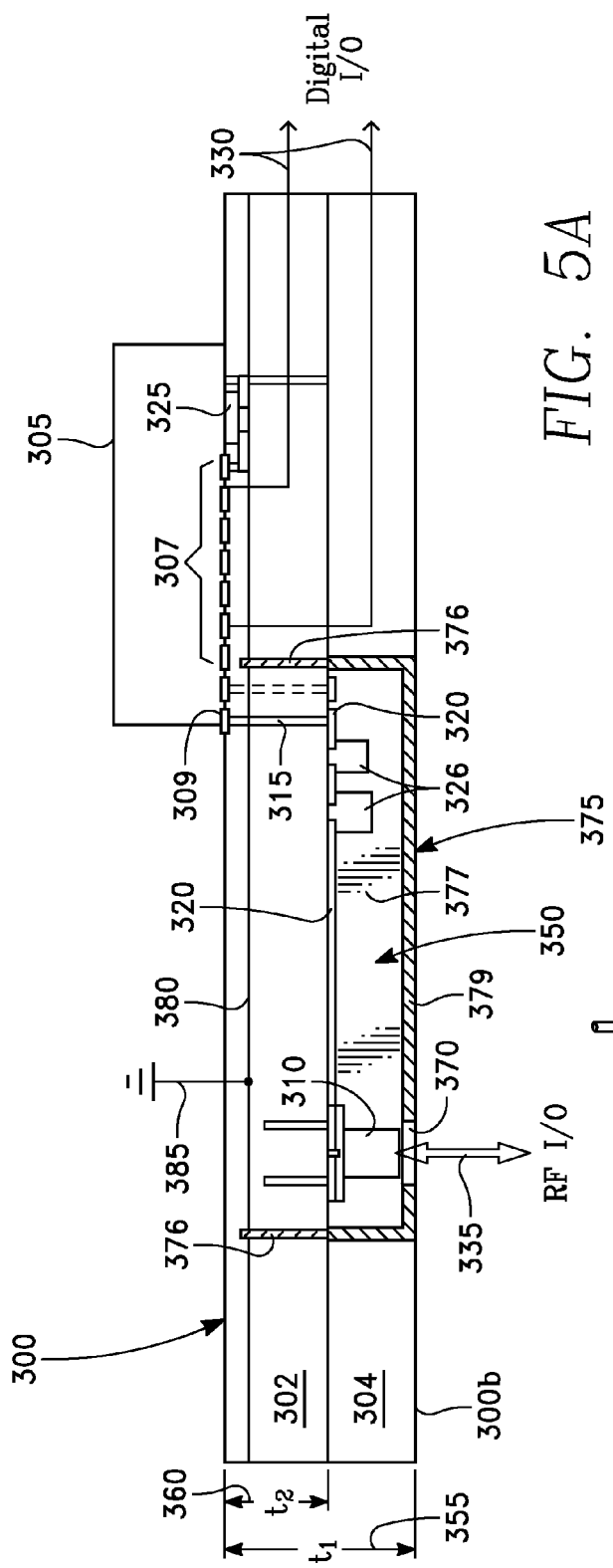
FIG. 5A is a diagram of a cross-sectional view of another embodiment of a DIB printed circuit board incorporating an encapsulating structure.

FIG. 5A is a diagram of a cross-sectional view of some embodiments of a DIB printed circuit board incorporating an encapsulating structure. The DIB printed circuit board 300 further includes an encapsulating structure 375 which may cover the cavity 350 while allowing a cable to be connected to the connector 310. The encapsulating structure 375 may form an isolating enclosure for the connector 310 and electronic components 325 mounted within the cavity 350. The encapsulating structure 375 may be inserted in the DIB printed circuit board 300 and connected to a ground reference point 385 through a ground plane metal layer 380 within the multiple laminate layer 302. In some embodiments, the encapsulating structure 375 is conducting and effectively forms a "Faraday cage" to electrically isolate the connector 310, metal wiring trace 320, and the components 325 from external interfering electronic noise, while allowing connection of a signal cable through.

Figure 5B:
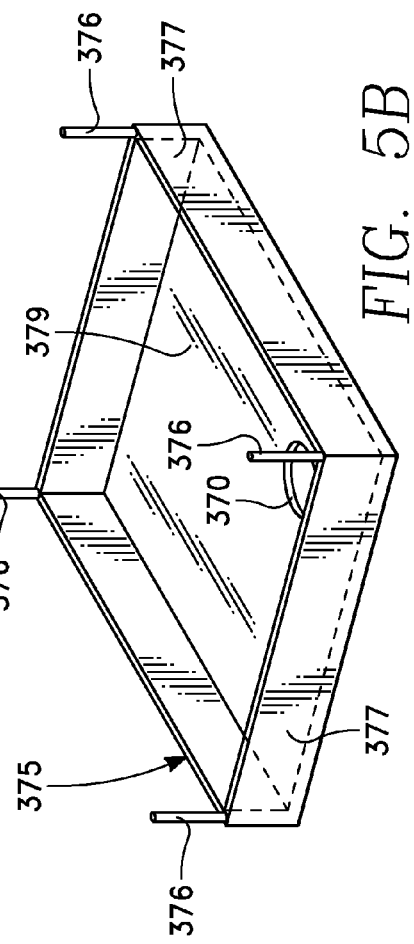
FIG. 5B shows a perspective view of one example of an encapsulating structure.

FIG. 5B shows a perspective view of one example of an encapsulating structure 375. The encapsulating structure 375 has an opening 370. The opening 370 will allow a cable (or the end of the connector 310) to pass through it. Thus a cable may be connected to the connector 310. The cable connects the DIB printed circuit board 300 to the test head 108 of FIG. 1 for transfer of the very high frequency RF signals 325 from the DUT socket 305 to the test head 108. Pins 376 are attached to the corners of the sides 377 of encapsulating structure 375. The encapsulating structure 375 is placed within the cavity 350 with the sides 377 of the encapsulating structure 375 touching sides of the cavity and the pins 376 are placed plated ground vias extending through the multiple laminate layer 302 to contact the ground plane 380. The length of the pins 376 is approximately the thickness 360 of the multiple laminate layer 302.

FIG. 6A is a diagram of a cross-sectional view of the embodiment of a DIB printed circuit board 300 of FIG. 5A illustrating another of the encapsulating structure 375. The basic structure of the encapsulating structure 375 is fundamentally as shown in FIG. 5A, except the encapsulating structure 375 does not include the pins 376 but slides within the sides of the cavity 350. The sides of the cavity 350 have a metallic layer 395 formed on its surface extending onto the bottom surface of the DIB printed circuit board 300. The encapsulating structure 375 is placed within the cavity 350 with the sides 377 of the encapsulating structure 375 touching the conductive metallic layer 395. The sides 377 of the encapsulating structure 375 are adhered to the metallic layer 395 by soldering or brazing 400 the sides 377 of the encapsulating structure 375 to the metallic layer 395. The metallic layer 395 is affixed to the ground vias 390a and 390b. The metallic layer 395 affixed to the vias 390a and 390b forms the connection to the ground reference point 385. The ground vias 390a and 390b is in contact with the ground plane 380 that is connected to the ground reference point 385. As in FIG. 5A, the encapsulating structure 375 effectively forms a "Faraday cage" to electrically isolate the connector 310, metal wiring trace 320, and the components 325 from external interfering electronic noise.

FIG. 6B shows a perspective view of a second example of an encapsulating structure 375. As shown in FIG. 6A, the encapsulating structure 375 may have an opening 370. The opening 370 will allow a cable to pass through it to be connected to the connector 310. The cable connects the DIB printed circuit board 300 to the test head 108 of FIG. 1 for transfer of the very high frequency RF signals 325 from the DUT socket 305 to the test head 108. In various embodiments, the encapsulating structure 375 may be a lid or other conductive covering device.

It should be noted that the various embodiments of the DIB printed circuit board 300 of FIGS. 4, 5, and 6A are shown with a single cavity 350 formed within the DIB printed circuit board 300. It is in keeping with the intent of this invention that multiple cavities 300 may be formed within the printed circuit board 300 dependent upon the number of high frequency signals and number of sites 335 being transferred from the test head 108 and the DUT 104 of FIG. 1. Further, the cavity 350 may have one or more connectors 310, one or more metal wiring traces 320, and one or more sets of the electronic components 325. Therefore the encapsulating structure 375 may have multiple openings 370 to allow multiple cables to connect to the connectors 310.

Figure 3B:
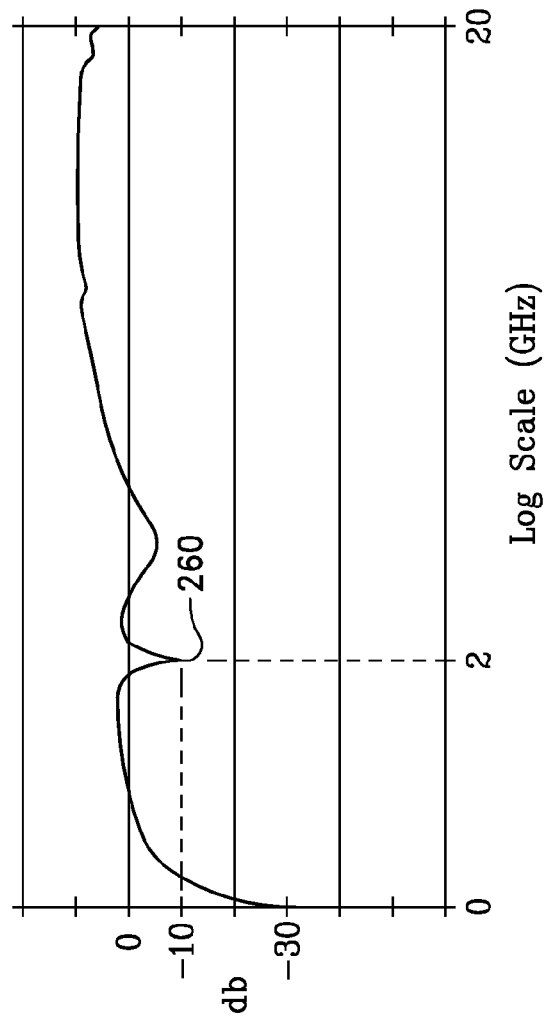
FIG. 3B is a plot of the forward reflection of a signal passed through the SMA coaxial connector through the via to a 50 Ω terminating resistor of FIG. 3A.
Figure 3A:
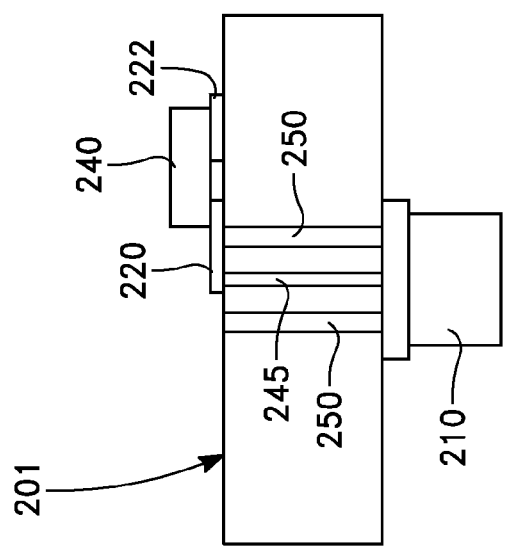
FIG. 3A is a diagram of an example of DIB printed circuit board used for measuring the performance of very high frequency analog signals.

Thus, as discussed above, a cavity is formed in a back side 300b of the printed circuit board which decreases the thickness of the printed circuit board to a second thickness. It has been observed by the present inventor that in thinner printed circuit board (approximately 2.54 mm) there is less than −30 dB signal reflection at 2 GHz, in the example of FIG. 3A. This is less than one percent (1%) of the delivered power that gets reflected at the SMA coaxial connector 210, as compared to −10 dB signal reflection 260 at 2 GHz, illustrated in FIG. 3B.

Referring to FIG. 4, in some embodiments, depending on the relative depth of the cavity 350, the cavity 350 may be positioned with respect to the DUT socket 305 so that the structural integrity of the printed circuit board 300 under and/or adjacent to the DUT socket 305 is not weakened to the extent that it causes fatigue and/or damage to the printed circuit board 300. Thus, in some embodiments, the cavity 350 may be offset to the side of the DUT socket 305 and thus not directly opposite the DUT socket 305. Other placement and geometry is possible to maintain a sufficient structural support for insertion and removal of DUT's to/from the DUT socket 305. If multiple cavities 350 are located on a printed circuit board 300, they may be spaced apart from each other so as to leave a lattice, or other support geometry of thicker portions of the printed circuit board 300 sufficient for structural support below and/or adjacent to the DUT socket 305, to inhibit stress failure during insertion and removal of DUT's. In other embodiments, the encapsulating structure 375, such as a rigid lid, and/or a rigid conductive covering material structure, adds structural support at the cavity 350 to allow more flexibility in the locations of one or more cavities 350.

It should be noted that the DUT socket 305 of FIGS. 4, 5A, and 6A connected to the device interface printed circuit board 300, is exemplary. Other embodiments may have other DUT interface structure, i.e. other DUT connection devices, such as a wafer probing apparatus, or other direct attach wafer testing device, or other interface device, associated with the device interface printed circuit board 300 which may be constructed in accordance with the description above.

While this invention has been particularly shown and described with reference to the embodiments thereof, it will be understood by those skilled in the art that various changes in form and details may be made without departing from the spirit and scope of the invention.

What is claimed is:

1. A device interface board for installation between a test head and at least one device-under-test within automatic test equipment, the device interface board comprising:
   a) a printed circuit board having a DUT side and a back side;
   b) at least one DUT interface structure associated with to the DUT side of the printed circuit board;
   c) a cavity in a back side of the printed circuit board, the cavity being separated from the DUT side by a portion of the printed circuit board of reduced thickness;
   d) at least one high frequency connector mounted on the back side within the cavity and at least one electronic component mounted on the back side within the cavity; and
   e) at least one signal via through the portion of the printed circuit board of reduced thickness, the at least one signal via coupling the at least one high frequency connector and the at least one electronic component to the at least one DUT interface structure,
   wherein the printed circuit board further comprises at least 20 layers.

2. The device interface board of claim 1, wherein the at least one DUT interface structure is a socket, and wherein the cavity is located in close proximity to the at least one DUT socket.

3. The device interface board of claim 1, wherein the at least one DUT interface structure is a socket, wherein the cavity is offset to a side of the at least one DUT socket.

4. The device interface board of claim 1 further comprising a plurality of cavities in the back side of the printed circuit board.

5. The device interface board of claim 1, wherein the high-frequency connector is a coaxial connector.

6. The device interface board of claim 1 further comprising a rigid encapsulating structure covering the cavity.

7. The device interface board of claim 1, wherein the printed circuit board has a thickness, and wherein the cavity extends into the printed circuit board for a fractional part of the thickness of the printed circuit board.

8. The device interface board of claim 1, wherein the at least one electronic component comprises impedance matching components.

9. The device interface board of claim 1 further comprising an encapsulating structure covering the cavity and constructed to allow a cable to be connected to the at least one high frequency connector.

10. The device interface board of claim 9, wherein the encapsulating structure electrically shields the cavity.

11. The device interface board of claim 10, wherein the encapsulating structure has an opening to allow a cable to pass through to the connector.

12. The device interface board of claim 10, wherein the encapsulating structure is connected to a ground reference point.

13. The device interface board of claim 12, wherein the encapsulating structure has sides electrically adhered to a conductive layer that is connected to the ground reference point through a ground via.

14. A device interface board for automatic test equipment, the device interface board comprising:
   a) a printed circuit board having a DUT side and a tester side, the printed circuit board comprising at least twenty wiring layers;
   b) a plurality of DUT connection devices mounted to the DUT side of the printed circuit board;
   c) a plurality of cavities formed into the tester side of the printed circuit board;
   d) within each of at least one of the plurality of cavities, a high frequency connector and electronic components mounted on the tester side and a signal trace of the printed circuit board electrically connecting the high-frequency connector and the component;
   e) a plurality of signal vias through the printed circuit board coupling the plurality of connectors and electronic component to the plurality of DUT connection devices; and
   f) at least one of the plurality of cavities having an enclosure lid shaped to at least partially shield at least one of the high-frequency connector, the signal trace, and the electronic component from external electronic noise,
   wherein the plurality of wiring layers comprises at least 20 layers.

15. The device interface board of claim 14, wherein the printed circuit board further comprises a plurality of wiring layers comprising at least 20 layers.

16. An automatic test equipment system comprising
   a) a test head; and
   b) a device interface board adjacent to the test head, the device interface board comprising:
      1) a printed circuit board comprising at least 20 layers;
      2) at least one DUT connection device mounted to a DUT side of the printed circuit board;
      3) a cavity in a back side of the printed circuit board;
      4) at least one high frequency connector and at least one electronic component mounted on the back side within the cavity; and
      5) at least one signal via through the printed circuit board to electrically connecting the at least one high frequency connector and the at least one electronic component to the at least one DUT connection device.

17. The automatic test equipment system of claim 16, wherein the at least one DUT interface connection is at least one socket, and wherein the cavity is located in close proximity to the at least one socket.

18. The automatic test equipment system of claim 16 further comprising a plurality of cavities in back side of the printed circuit board.

19. The automatic test equipment system of claim 16, wherein the printed circuit board further comprises a rigid encapsulating structure covering at least one of the plurality of cavities.

20. The automatic test equipment system of claim 16, wherein the printed circuit board has a thickness, and wherein the cavity extends into the printed circuit board for a fractional part of the thickness of the printed circuit board.

21. The automatic test equipment system of claim 16 further comprising:
  an encapsulating structure covering the cavity;
  a cable passing through the encapsulating structure and connected to a high frequency connector of the at least one high-frequency connector.

22. The automatic test equipment system of claim 21, wherein the encapsulating structure electrically shields the cavity.

23. The automatic test equipment system of claim 22, wherein the encapsulating structure has an opening to allow a cable to pass through to the connector.

24. The automatic test equipment system of claim 22, wherein the encapsulating structure is connected to a ground reference point.

25. The automatic test equipment system of claim 24, wherein the encapsulating structure has sides electrically adhered to a conductive layer that is connected to the ground reference point through a ground via.

26. A device interface board for automatic test equipment, the device interface board comprising:
  a) a printed circuit board having a DUT side and a tester side, the printed circuit board comprising a plurality of wiring layers;
  b) a plurality of DUT connection devices mounted to the DUT side of the printed circuit board;
  c) a plurality of cavities formed at least half way into tester side of the printed circuit board;
  d) within each of at least one of the plurality of cavities, a high frequency connector and electronic components mounted on the tester side and a signal trace of the printed circuit board electrically connecting the high-frequency connector and the component;
  e) a plurality of signal vias through the printed circuit board coupling the plurality of connectors and electronic component to the plurality of DUT connection devices; and
  f) at least one of the plurality of cavities having an enclosure lid, wherein the plurality of wiring layers comprises at least 20 layers.

* * * * *

UNITED STATES PATENT AND TRADEMARK OFFICE
CERTIFICATE OF CORRECTION

PATENT NO. : 8,461,855 B2
APPLICATION NO. : 12/572955
DATED : June 11, 2013
INVENTOR(S) : Peter Hotz et al.

It is certified that error appears in the above-identified patent and that said Letters Patent is hereby corrected as shown below:

In the Claims:

In column 7, line 36, in Claim 1, delete "high frequency" and insert -- high-frequency --, therefor.

In column 8, line 4, in Claim 9, delete "high frequency" and insert -- high-frequency --, therefor.

In column 8, line 21, in Claim 14, delete "at least twenty" and insert -- a plurality of --, therefor.

In column 8, line 28, in Claim 14, delete "high frequency" and insert -- high-frequency --, therefor.

In column 8, line 28, in Claim 14, delete "electronic" and insert -- an electronic --, therefor.

In column 8, line 28, in Claim 14, delete "components" and insert -- component --, therefor.

In column 8, line 54, in Claim 16, delete "high frequency" and insert -- high-frequency --, therefor.

In column 8, lines 57-58, in Claim 16, delete "board to" and insert -- board --, therefor.

In column 8, lines 58-59, in Claim 16, delete "high frequency" and insert -- high-frequency --, therefor.

In column 9, line 13, in Claim 21, delete "high frequency" and insert -- high-frequency --, therefor.

In column 10, line 11, in Claim 26, delete "into" and insert -- into the --, therefor.

In column 10, line 14, in Claim 26, delete "electronic" and insert -- an electronic --, therefor.

In column 10, line 14, in Claim 26, delete "components" and insert -- component --, therefor.

In column 10, lines 16-17, in Claim 26, delete "high-frequency" and insert -- high frequency --, therefor.

Signed and Sealed this
Twenty-fourth Day of September, 2013

Teresa Stanek Rea
*Deputy Director of the United States Patent and Trademark Office*